United States Patent
Vargas et al.

(10) Patent No.: US 7,390,617 B2
(45) Date of Patent: Jun. 24, 2008

(54) SELECTIVE LIGHT ABSORPTION SHIFTING LAYER AND PROCESS

(75) Inventors: J. Ramon Vargas, Webster, NY (US); Denis Y. Kondakov, Kendall, NY (US); Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 652 days.

(21) Appl. No.: 10/882,028

(22) Filed: Jun. 30, 2004

(65) Prior Publication Data

US 2006/0003258 A1 Jan. 5, 2006

(51) Int. Cl.
*H01S 3/00* (2006.01)
(52) U.S. Cl. .......................................... 430/321; 372/39
(58) Field of Classification Search .................. None
See application file for complete search history.

(56) References Cited

U.S. PATENT DOCUMENTS

| | | | |
|---|---|---|---|
| 4,251,622 A | 2/1981 | Kimoto et al. | |
| 4,782,006 A | 11/1988 | Nishimura et al. | |
| 5,086,430 A | 2/1992 | Kapon et al. | |
| 5,270,727 A | 12/1993 | Yamamoto et al. | |
| 6,690,697 B1 | 2/2004 | Kahen | |
| 6,728,278 B2 | 4/2004 | Kahen et al. | |
| 6,934,313 B1 * | 8/2005 | Deacon | 372/64 |
| 2004/0076203 A1 | 4/2004 | Kaminsky et al. | |
| 2005/0276295 A1 * | 12/2005 | Kahen et al. | 372/39 |

FOREIGN PATENT DOCUMENTS

| | | |
|---|---|---|
| EP | 0 511 403 | 11/1997 |
| EP | 1 411 607 | 4/2004 |
| JP | 6-347633 | 12/1994 |
| JP | 8-35184 | 2/1996 |
| JP | 2000-206645 | 7/2000 |
| JP | 2002-293039 | 10/2000 |

OTHER PUBLICATIONS

E. Sawicki, "Physical Properties of the Aminoazobenzene Dyes. VII. Absorption Spectra of 4-Aminoazobenzene Dyes in Ethanol", J. Org. Chem., Aug. 1957, vol. 22, pp. 915-919.

B. K. Barnett et al., "Quantitative Photodecarbonylation of Formanilides: a New Photosensitive Protecting Group for Anilines", J. Chem. Soc. Chem. Comm., (1972) p. 758.

* cited by examiner

*Primary Examiner*—John A. McPherson
(74) *Attorney, Agent, or Firm*—Arthur E. Kluegal (57) ABSTRACT

The invention includes a process for forming a laser pixel array useful with a pump-beam, comprising:
a) forming a layer containing a formamide of an amino dye compound on a support wherein the layer absorbs light outside the laser wavelength and predominantly outside the pump-beam wavelength range; and
b) subjecting the layer to UV radiation in the areas of the layer where it is desired to be free of pixels for a time sufficient to shift the absorption envelope of the areas into the pump-beam wavelength range. The invention also provides for unimolecularly forming an image or an information record and a composition of matter. The invention provides methods for forming filters, images or information records having a smooth surface and in particular for forming a pixel region pattern for use with an Organic VCSEL that would ease manufacturing.

18 Claims, 3 Drawing Sheets

SELECTIVE LIGHT ABSORPTION SHIFTING LAYER AND PROCESS

FIELD OF THE INVENTION

This invention relates to a layer and a unimolecular reaction process for selective formation of a pattern of shifted light absorption useful to make a laser pixel array for use with a pump-beam, as a filter array having a smooth surface, and as an information record. A formamide of an amino dye compound is useful to form such a layer.

BACKGROUND OF THE INVENTION

Vertical cavity surface emitting lasers (VCSELs) based on inorganic semiconductors (e.g., AlGaAs) have been developed since the mid-80's (K. Kinoshita et al., *IEEE J. Quant. Electron.* QE-23, 882 (1987)). They have reached the point where AlGaAs-based VCSELs emitting at 850 nm are manufactured by a number of companies and have lifetimes beyond 100 years (K. D. Choquette et al., *Proc. IEEE* 85, 1730 (1997)). With the success of these near-infrared lasers in recent years, attention has turned to other inorganic material systems to produce VCSELs emitting in the visible wavelength range (C. Wilmsen et al., *Vertical-Cavity Surface-Emitting Lasers*, Cambridge University Press, Cambridge, 2001). There are many fruitful applications for visible lasers, such as display, optical storage reading/writing, laser printing, and short-haul telecommunications employing plastic optical fibers (T. Ishigure et al., *Electron. Lett.*, 31, 467 (1995)). In spite of the worldwide efforts of many industrial and academic laboratories, much work remains to create viable laser diodes (either edge emitters or VCSELs), which span the visible spectrum.

In the effort to produce visible wavelength VCSELs, it would be advantageous to abandon inorganic-based systems and focus on organic-based laser systems. Organic materials have properties making them suitable for gain media in these lasers, such as low scattering/absorption losses and high quantum efficiencies. Organic lasers offer the advantage over inorganic systems in that they are relatively inexpensive to manufacture and can be made to emit over the entire visible range.

The usual route for making a manufacturable laser diode system is to use electrical injection rather than optical pumping to create the necessary population inversion in the active region of the device. This is the case for inorganic systems, since their optically pumped thresholds for broad-area devices are on the order of $10^4$ W/cm$^2$ (P. L. Gourley et al., *Appl. Phys. Lett.* 54, 1209 (1989)). Such high power densities can only be obtained by using other lasers as the pump sources, precluding that route for inorganic laser cavities. Unpumped organic laser systems have greatly reduced combined scattering/absorption loss (~0.5 cm$^{-1}$) at the lasing wavelength, especially if a host-dopant combination is used as the active media. As a result, optically pumped power thresholds below 1 W/cm$^2$ should be attainable, especially when a VCSEL-based microcavity design is employed in order to minimize the active volume (which results in lower thresholds). At these threshold power levels it becomes possible to optically pump organic-based vertical laser cavities using incoherent light-emitting diodes (LEDs). This result is highly significant for amorphous organic laser systems, since driving them by electrical injection has, to this date, been unobtainable mainly as a result of the low carrier mobility of organic materials (N. Tessler et al., *Appl. Phys. Lett.*, 74, 2764 (1999)).

It is possible to provide an organic surface-emitting laser arrangement that is particularly suitable to permitting optimization of the organic active region, improving power conversion efficiency, and removing unwanted spontaneous emission by constructing an organic vertical cavity surface-emitting laser device (Organic VCSEL) that produces light, for example, see U.S. Pat. Nos. 6,728,278, 6,690,697, US 2004/0076203 and references cited therein.

Desirably the device comprises: a bottom dielectric stack reflective to light over a predetermined range of wavelengths; an organic active region for producing laser light, and including emissive material; a top dielectric stack spaced from the bottom dielectric stack and reflective to light over a predetermined range of wavelengths; a pump-beam light is transmitted and introduced into the organic active region through at least one of the dielectric stacks; and the organic active region includes one or more periodic gain region(s) and organic spacer layers disposed on either side of the periodic gain region(s) and arranged so that the periodic gain region(s) is aligned with the antinodes of the device's standing wave electromagnetic field, and wherein the spacer layers are substantially transparent to the laser light.

Figure 1:
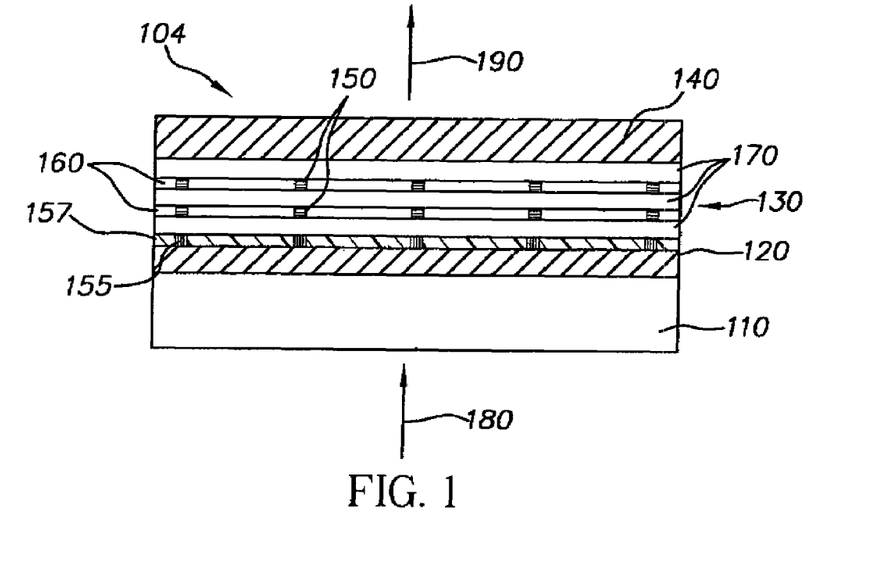
FIG. 1. Depicts a side view schematic of an optically pumped two-dimensional organic vertical cavity laser array.
Figure 2:
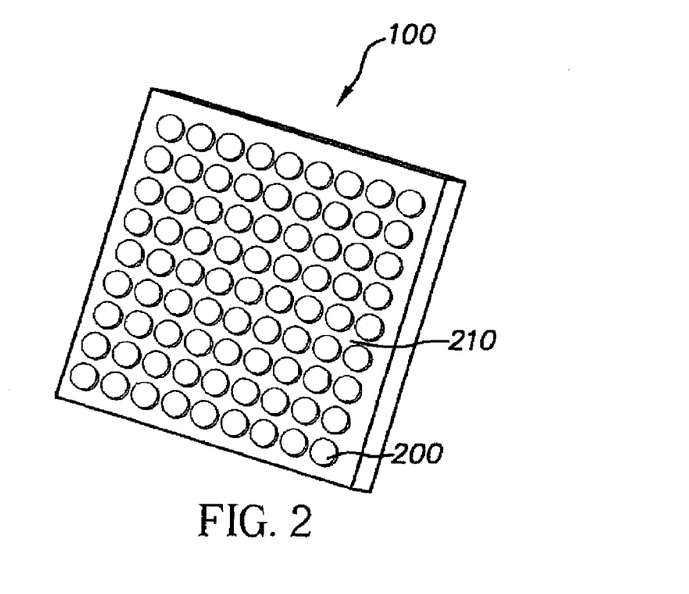
FIG. 2 Depicts a top view schematic of the dye layer 157 (FIG. 1) showing the pixel pattern.

To enable a large area laser structure, which emits single- or multi-mode (a few modes), it is advantageous to construct a two-dimensional laser array device as shown schematically in FIG. 1. FIG. 2 shows a top view of the two-dimensional laser array device where on the surface of the VCSEL there are lasing pixels 200 separated by interpixel regions 210. In general the lasing pixels 200 are regions where the net gain of the device is larger than in the interpixel regions 210. As applied to two-dimensional inorganic laser arrays, a route for varying the net gain of the device is to modulate the reflectance of the top dielectric stack by either adding metal (E. Kapon and M. Orenstein, U.S. Pat. No. 5,086,430) or by deep etching into the top dielectric stack (P. L. Gourley et al., *Appl. Phys. Lett.*, 58, 890 (1991)). In both inorganic laser array cases, the laser pixels were on the order of 3-5 µm wide (so as to enable single-mode action) and the interpixel spacing was 1-2 µm. This technique can be applied to organic laser systems. The metal can be deposited by either conventional thermal evaporation, sputtering or electron-beam deposition techniques. The metal is patterned using standard photolithographic and etching techniques, thus forming a two-dimensional array of circular metallic pits on the surface of the substrate. The metal is removed from the laser pixel regions, while the metal remains in the interpixel regions. As a result, the reflectance of the device is smaller where the metal remains. However, it is very difficult to perform micron-scale patterning in a reproducible fashion on the laser structure once the organic layers have been deposited.

In another approach, the lower net gain regions are created by locally spoiling the emissive properties of the periodic gain region(s). This process uses standard photolithographic masks and UV exposing apparatus in order to create a patterned UV exposure of the periodic gain region(s). Since organic media is sensitive to high intensity UV radiation (for example the mercury arc lamp's i-line at 365 nm), this technique works very effectively to lower the emissive intensity of the UV exposed areas of the periodic gain region(s) by irreversibly changing the properties of the emissive material. In this case the UV exposed areas correspond to the interpixel region, while the unexposed areas correspond to the laser pixels. However this method has not been fully established and alternative methods of forming the laser pixel pattern are highly desirable.

Many methods have been described for formation of a micro-pattern or image, including those using the lithographic process, for example see M. Bowden, *J. Electro. Chem. Soc.*, 128, 195C-214C (1981) for a review. Other methods include those reported in U.S. Pat. Nos. 5,270,727, 4,782,006, 4,251,622, EP 0511403, JP 2002/293039, JP 2000/206645, JP 08035184, JP 06347633. However, many of these methods are not readily applied to the type of patterning needed in an Organic VCSEL because they leave the surface of the pattern pitted and not smooth, which can cause undesirable optical problems including light scattering. In some cases several components are required to generate the pattern and it would be desirable to find a simpler method.

B. K. Barnett and T. D. Roberts, *J. Chem. Soc. Chem. Comm.*, 758 (1972) have described the quantitative photodecarbonylation of formanilides to give anilines. This technique has not been suggested for amino substituted dye molecules or for imaging applications.

Thus, there remains a need to find new methods to form filters, images or information records having a smooth surface and in particular to form a pixel region pattern for use with an Organic VCSEL that would offer ease of manufacturing.

SUMMARY OF THE INVENTION

The invention provides a process for forming a laser pixel array useful with a pump-beam, comprising:

a) forming a layer containing a formamide of an amino dye compound on a support wherein the layer absorbs light outside the laser wavelength and predominantly outside the pump-beam wavelength range; and b) subjecting the layer to UV radiation in the areas of the layer where it is desired to be free of pixels for a time sufficient to shift the absorption envelope of the areas into the pump-beam wavelength range.

The invention also provides for forming an image or an information record and a composition of matter. The invention provides methods for forming filters, images or information records having a smooth surface and in particular for forming a pixel region pattern for use with an Organic VCSEL that would ease manufacturing.

DETAILED DESCRIPTION OF THE INVENTION

A new process for forming a laser pixel array for use with a pump-beam involves forming a layer containing a formamide of an amino dye compound on a support, wherein the layer absorbs light outside the laser wavelength and predominantly outside the pump-beam wavelength range. The layer is then subjected to UV radiation in the areas of the layer where it is desired to be free of pixels for a time sufficient to shift the absorption envelope of the layer into the pump-beam wavelength range.

In one embodiment the pump-beam is part of an Organic VCSEL device. FIG. 1 schematically represents an illustrative example of such a device. The substrate 110 can either be light transmissive or opaque, depending on the intended directions of optical pumping or laser emission. The substrate 110 may be transparent glass or plastic. Alternatively, opaque substrates including, but not limited to, semiconductor materials (e.g., silicon) or ceramic materials may be used in the case where optical pumping and laser emission occur from the same surface.

On the substrate 110 is deposited the bottom dielectric stack 120 which is composed of alternating high and low refractive index dielectric materials. In general, the bottom dielectric stack 120 is designed to be reflective to laser light over a predetermined range of wavelengths. Typical high and low refractive index materials are $TiO_2$ and $SiO_2$, respectively. The bottom dielectric stack 120 can be deposited by standard electron-beam deposition, where a typical deposition temperature is about 240° C.

Dye layer 157 is then deposited on the dielectric stack 120. The dye layer 157 may be comprised of a single component or a mixture of several components. In one embodiment dye layer 157 includes a formamide of an amino dye compound. In one suitable embodiment the compound is coated with one or more binding agents that disperse the compound to form the dye layer 157. Binding agents may include high polymeric materials which are compatible with the dye and do not absorb light predominantly in a wavelength region that includes the laser wavelength and the pump-beam wavelength range. Example of binders are polyamide resins such as nylons, urea resins such as butylated urea resin, urethane resins, melamine resins, vinyl acetate polymers (homopolymers and copolymers) and their partially saponified products, epoxy resins, cellulose resins, butyral resins, acetal, acryl resins, alkyd resins, unsaturated polyester resins, copolymers of styrene or its derivative, phenol resins. Typically the layer is coated by spin casting but other methods may also be used.

Desirably the formamide of the dye compound absorbs light predominantly at wavelengths outside the laser wavelength and predominantly outside the pump-beam wavelength range. Suitably the formamide of the dye compound absorbs less than 10% of the light at the laser wavelength and typically less than 5% and desirably less than 1%. The formamide of the dye compound suitably absorbs less than 50% of the pump-beam light and desirably less than 20% or even less than 10%.

For example, if the laser emits blue light of predominantly 470 nm wavelength, then the formamide substituted dye compound should not absorb significant amounts of light at 470 nm. It may absorb light at a deeper or shorter wavelength (desirably it would absorb at a shorter wavelength). Similarly, if the pump-beam emits light at a maximum wavelength of 395 nm and predominantly in a range of 375 to 415 nm, then the formamide substituted dye compound should not absorb significant amounts of light at 395 nm or in the range of 375 to 415 nm. It may absorb light at a deeper wavelength but desirably at a shorter wavelength.

Typically the laser will have a wavelength of maximum intensity in the visible region of light such as 420 nm to 490 nm and typically 450 to 470 nm for blue light, 500 to 600 nm and commonly 520 nm to 550 nm for green light, and 600 to 700 nm and commonly 630 to 650 nm for red light.

Typically a pump-beam used for this application will have a wavelength maximum of 370 to 410 nm and commonly 390 to 410 nm, with a half-band width commonly of 30-50 nm. However, it may be desirable to use pump-beams of different wavelengths than these.

After the dye layer 157 is formed, it is subjected to UV radiation in the interpixel regions 210 for a time sufficient to shift the absorption envelope of the dye layer 157 into the pump-beam wavelength range. UV radiation in the region of 220 to 400 nm is commonly used, and more typically in the range of 240 nm to 370 nm. The wavelength of the UV exposure is chosen such that the formamide of the dye compound absorbs at least some of the UV light and the energy of the UV light absorbed is sufficient to cause the dye to undergo a reaction wherein the absorption envelope of the dye shifts. In one embodiment a UV photolithographic stepper (248 nm) selectively exposes the dye layer 157 by usage of a standard photolithographic mask in order to create the absorbing elements 155. Since the pump-beam is absorbed by the absorbing elements 155, this results in the formation of the lower net gain region 150 in the periodic gain region 160. As a consequence, the interpixel region 210 corresponds to the lower net gain region 150, while the remaining part of the periodic gain region 160 corresponds to the laser pixels 200.

The portion of the layer that has been exposed to UV radiation corresponding to the interpixel region should not absorb significant amount of light at the laser wavelength. In one embodiment, the interpixel region should absorb less than 10% of the light at the laser wavelength and typically less than 5% and desirably less than 1% of the light. For example, if the laser emits blue light of predominantly 470 nm wavelength, then desirably the dye compound formed upon UV exposure should still not absorb more than 10% of the light at 470 nm.

Suitably, after UV exposure, the dye compound should absorb at least 70% of pump-beam light, typically at least 80% and desirably at least 90% of the light.

When the formamide of the dye compound absorbs UV radiation, the formamide group is removed and is released as $CO_2$ and the dye compound lacking the formamide group is formed. As a consequence of loss of the formamide group, the hue of the dye shifts causing the maximum absorption wavelength of the layer to change. Suitably the maximum absorption wavelength shifts by at least 20 nm, desirably by 30, 40, or even 50 nm.

The hue-shifting reaction is unimolecular and the change in the absorption maximum of the layer containing the dye does not depend on the concentration of more than one reactant. The reaction does not cause a pitting or non-uniformity of the surface because only $CO_2$ is lost, thus the surface of the layer remains as uniform or smooth as it was initially.

In this manner laser pixels are created. For example, such as those represented in FIG. 2, wherein the unexposed regions correspond to laser pixels 200 and exposed regions correspond to interpixel regions 210.

In one desirable embodiment the shape of the laser pixels created is circular; however, other pixel shapes are possible, such as, rectangular. The size of the laser pixels is suitably in the range of 2.5 to 20 microns. For single mode laser operation, the preferred laser pixel diameter is 3 to 5 μm. The interpixel spacing is in the range of 0.25 to 4 μm. In general, the spaced laser pixels can have the same or different sizes and the spacings between pixels can have the same or different lengths to cause the output of the two-dimensional laser array device to produce single or multimode laser output.

Forming a linear array of laser pixels is possible, even though it may not be preferred in most instances since it would lead to poorer conversion of the incoming pump-beam power. Even though weak confinement of the laser emission to the laser pixels via net gain modulation can lead to phase-locked single mode lasing action in the best case, if phase-locking is only localized or if higher-order array modes are prevalent, then multimode lasing action will occur. In instances where reduction of speckle is important, for example in display applications, then multimode lasing action is preferred. In such cases, in order to spoil even localized phase-locking, the size of the laser pixels can be randomly varied from site to site,

The formamide of an amino dye compound is desirably one in which the amino group is part of the chromophore, and in which the formamide of the dye and the dye have a different wavelengths of maximum absorption. In one embodiment the formamide of an amino dye compound is represented by Formula (1).

(1)

In Formula (1), R represents hydrogen or a substituent such as a methyl group, an ethyl group, or a phenyl group. $Ar^1$ represents a divalent aromatic group, such as a 1,4-phenylene group or a 2,5-thiophenylene group. $Ar^2$ represents an aromatic group, for example, a phenyl group, thiophenyl group, or a pyridinyl group. The term aromatic group includes aromatic groups containing heteroatoms as well as aromatic hydrocarbons. W represents N or C—X, where X represents hydrogen or a substituent such as a methyl or phenyl group.

In one desirable embodiment the form amide of an amino dye compound is represented by Formula (2).

(2)

In Formula (2), R, X, and $Ar^2$ were described previously, each d represents an independently selected substituent, such as a methyl group or phenyl group and n is 0-4, provided that adjacent substituents may combine to form a ring. In one embodiment $Ar^2$ represents an aryl group, for example a phenyl group or a 2-hydroxy phenyl group.

In another desirable embodiment the formamide of an amino dye compound is represented by Formula (3).

(3)

In Formula (3), R d, n, and $Ar^2$ were described previously. In one embodiment $Ar^2$ represents an aryl group, for example a phenyl group or a 2-hydroxy phenyl group.

In another suitable embodiment the formamide of an amino dye compound represented by Formula (4).

(4)

In Formula (4), R, d, n have been described previously. $R^1$ represents hydrogen or a substituent such as a methyl group or ethyl group, each j represents an independently selected substituent such as a methyl group or methoxy group, provided adjacent substituents may combine to form rings, m is 0-4.

Formamides of amino dye compounds can be made by various methods. For example, by formulating an amino dye by methods such as those referenced in T. W. Greene and P G. M. Wuts, *Protective Groups In Organic Synthesis*, Hohen Wiley & Sons, New York, pages 349-350. The hue of compound of Formula (3) can be adjusted by changing the substituents, for example, see E. Sawicki, *J. Org. Chem.*, 22, 915, (1957).

Illustrative examples of a formamide of an amino dye compound useful in the present invention include the following compounds.

Inv-1

Inv-2

Inv-3

Inv-4

Inv-5

Inv-6

Inv-7

Inv-8

Inv-9

Inv-10

Inv-11

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecyl amino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonyl amino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl;

quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

Referring back to FIG. 1, following the creation of the layer 157, the active region 130 and top dielectric stack 140 are deposited in sequence. The active region 130 is not a bulk layer but a multilayer composite. Following the suggestions of Brueck et al. (U.S. Pat. No. 4,881,236) for inorganic lasers, the active region 130 contains one or more periodic gain regions 160, which are separated by spacer layers 170. The thickness of the periodic gain regions 160 is typically less than 50 nm, with a preferred thickness of 5 to 30 nm. The thicknesses of the spacer layers 170 are chosen such that the periodic gain region(s) is aligned with the antinodes of the laser cavity's standing electromagnetic field (e-field). Employing periodic gain region(s) in the active region results in larger power conversion efficiencies and a large reduction in the unwanted spontaneous emission. In summary, the active region 130 includes one or more periodic gain regions 160 and spacer layers 170 disposed on either side of the periodic gain region(s) and arranged so that the periodic gain region(s) is aligned with the antinodes of the device's standing wave electromagnetic field.

The periodic gain region(s) 160 is composed of either small-molecular weight organic material or polymeric organic material, which fluoresce with a high quantum efficiency. The small-molecular weight organic material is typically deposited by high-vacuum ($10^{-6}$ Torr) thermal evaporation, while the conjugated polymers are usually formed by spin casting.

The periodic gain region(s) 160 (or emissive material) can be comprised of a single host material, but more commonly includes a host material doped with a guest compound (dopant) or compounds where light emission comes primarily from the dopant and can be of any color. These host-dopant combinations are advantageous since they result in very small unpumped scattering/absorption losses for the gain media (can be less than 1 $cm^{-1}$). The dopant is usually chosen from highly fluorescent dyes, but phosphorescent compounds, e.g., transition metal complexes as described for OLED applications in WO 98/55561, WO 00/18851, WO 00/57676, and WO 00/70655 are also useful. Dopants are typically coated as 0.01 to 10% by weight into the host material, wherein they can be selected to provide emitted light having hues of either red, green, or blue. An example of a useful host-dopant combination for red emitting layers is Alq as the host material and 1% L39 [4-(dicyanomethylene)-2-t-butyl-6-(1,1,7,7-tetramethyljulolidyl-9-enyl)-4H-pyran] as the dopant.

An important relationship for choosing a dye as a dopant is a comparison of the absorption of the dopant material and emission of the host material. For efficient energy transfer (via Forster energy transfer) from the host to the dopant molecule, a necessary condition is that the absorption of the dopant overlaps the emission of the host material. Those skilled in the art are familiar with the concept of Forster energy transfer, which involves a radiationless transfer of energy between the host and dopant molecules. An important relationship for choosing the host material is that the absorption of the host material significantly overlaps the emission spectrum of the pump-beam 180 light. In addition it is preferred that the absorption of the host material or a host material plus a dopant is small at the laser emission wavelength of the device 100. An acceptable level of absorption is that the absorption coefficient of the host plus dopant combination is less than 10 $cm^{-1}$ at the wavelength of the laser emission.

Useful fluorescent emissive materials includes polycyclic aromatic compounds as described in I. B. Berlman, "Handbook of Fluorescence Spectra of Aromatic Molecules," Academic Press, New York, 1971 and EP 1 009 041. Tertiary aromatic amines with more than two amine groups can be used including oligomeric materials.

Another class of useful emissive materials (for host or dopants) include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or an oligomeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:

$R_1$ and $R_2$ each independently represent a hydrogen atom, an aryl group, or an alkyl group or $R_1$ and $R_2$ together represent the atoms completing a cycloalkyl group; and R₃ and R₄ each independently represent an aryl group, which is in turn substituted with a diaryl substituted amino group, as indicated by structural Formula C.

C wherein R₅ and R₆ are independently selected aryl groups. In one embodiment, at least one of R₅ or R₆ contains a polycyclic fused ring structure, e.g., a naphthalene.

The host material can comprise a substituted or unsubstituted triarylamine compound. Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:
each Are is an independently selected arylene group, such as a phenylene or anthracene moiety;
n is an integer of from 1 to 4; and
Ar, R₇, R₈, and R₉ are independently selected aryl groups.
In a typical embodiment, at least one of Ar, R₇, R₈, and R₉ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The emissive material can be formed of a single or a mixture of aromatic tertiary amine compounds. Specifically, one can employ a triarylamine, such as a triarylamine satisfying the Formula B, in combination with a tetraaryldiamine, such as indicated by Formula D. The host material can include a substituted or unsubstituted dicarbazole-biphenyl compound. Illustrative of useful aromatic tertiary amines is the following:

4,4'-N,N'-dicarbazole-1,1'-biphenyl (CBP) (D1)
4,4'-Bis[N-(1-naphthyl)-N-phenylamino]biphenyl (D2)
4,4'-Bis[N-(1-naphthyl)-N-(2-naphthyl)amino]biphenyl (D3)
4,4'-Bis[N-(2-naphthyl)-N-p-tolylamino]biphenyl (D4)
1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

The host material can comprise a substituted or unsubstituted aza-aromatic compound. For example, the host material can comprise a substituted or unsubstituted acridine, quinoline, purine, phenazine, phenoxazine, or phenanthroline compound. Carbazole derivatives are useful hosts. Useful examples of phenanthroline materials include 2,9-dimethyl-4,7-diphenyl-1,10-phenanthroline and 4,7-diphenyl-1,10-phenanthroline.

Host and dopant molecules include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

E wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material can comprise a substituted or unsubstituted chelated oxinoid compound.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-□-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

The host material can include a substituted or unsubstituted anthracene compound.

Derivatives of 9,10-di-(2-naphthyl)anthracene (Formula F) constitute one class of useful hosts capable of supporting photoluminescence, and are particularly suitable for light emission of wavelengths longer than 400 nm, e.g., blue, green, yellow, orange or red.

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxyl amino, alkylamino, or arylamino of from 1 to 24 carbon atoms; and Group 6: fluorine, chlorine, bromine or cyano.

Illustrative examples include 9,10-di-(2-naphthyl)anthracene (F1) and 2-t-butyl-9,10-di-(2-naphthyl)anthracene (F2). Other anthracene derivatives can be useful as a host, including derivatives of 9,10-bis-(4-(2,2'-diphenylethenyl)phenyl)anthracene.

Benzazole derivatives (Formula G) constitute another class of useful hosts capable of supporting photoluminescence, and are particularly suitable for light emission of wavelengths longer than 400 nm, e.g., blue, green, yellow, orange or red:

G where:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together. An example of a useful benzazole is 2,2', 2"-(1,3,5-phenylene)tris[1-phenyl-1H-benzimidazole].

The host material can comprise a substituted or unsubstituted benzoxazole compound, a substituted or unsubstituted benzthiazole compound, or a substituted or unsubstituted benzimidazole compound. The host material can comprise a substituted or unsubstituted oxazole compound, a substituted or unsubstituted triazole compound, or a substituted or unsubstituted oxadiazole compound. Useful examples of oxazole compounds include 1,4-bis(5-phenyloxazol-2-yl)benzene, 1,4-bis(4-methyl-5-phenyloxazol-2-yl)benzene, and 1,4-bis(5-(p-biphenyl)oxazol-2-yl)benzene. Useful examples of oxadiazole compounds include 2-(4-biphenylyl)-5-phenyl-1,3,4-oxadiazole and 2-(4-biphenylyl)-5-(4-tert-butylphenyl)-1,3,4-oxadiazole. Useful examples of triazole compounds include 3-(4-biphenylyl)-4-phenyl-5-tert-butylphenyl-1,2,4-triazole.

Distyrylarylene derivatives are also useful as host materials or dopant materials, many examples are described in U.S. Pat. No. 5,121,029. Useful emissive materials (hosts and dopants) can have the general Formulae (H) or (I):

X—CH=CH—Y—CH=CH-Z (H)

X—(CH=CH)$_n$-Z (I)

where:

X and Z are independently a substituted or unsubstituted aromatic group or a substituted or unsubstituted aromatic complex ring group having one nitrogen atom;

n equals 1, 2, or 3; and

Y is a divalent aromatic group or a divalent aromatic complex ring group having one nitrogen atom. Useful examples include 1,4-bis(2-methylstyryl)-benzene, 4,4'-(9,10-anthracenediyldi-2,1-ethenediyl)bis(N,N-bis(4-methylphenyl)-benzenamine, 4,4'-(1,4-naphthalenediyldi-2,1-ethenediyl)bis(N,N-bis(4-methylphenyl)benzenamine, and 4,4'-(1,4-phenylenedi-2,1-ethenediyl)bis(N,N-(4-tolyl)) benzeneamine.

The dopant is selected to provide emission between 300-1700 nm. The dopant can be selected from fluorescent or phosphorescent dyes. Useful fluorescent dopants include materials as described as host materials above. Other useful fluorescent dopants include, but are not limited to, derivatives of substituted or unsubstituted anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, napthyridine, fluoranthene, furan, indole, thiaphene, benzoxanthene, pyrene, peropyrene, terphenyl, quaterphenyl, quinquephenyl, sexiphenyl, anthanthrene, bisanthrene compounds, N,N,N',N'-tetrasubstituted benzidene derivatives, N,N,N',N'-tetraryl-benzidene derivatives and carbostyryl compounds or combinations thereof. Derivatives of these classes of materials can also serve as useful host materials or combinations thereof. Host materials will often be compounds containing at least three phenylene moieties.

Illustrative examples of useful dopants include, but are not limited to, the following:

L1

L2

L3

L4

L5

L6

-continued

L7

L8

|     | X | R1      | R2      |
|-----|---|---------|---------|
| L9  | O | H       | H       |
| L10 | O | H       | Methyl  |
| L11 | O | Methyl  | H       |
| L12 | O | Methyl  | Methyl  |
| L13 | O | H       | t-butyl |
| L14 | O | t-bytyl | H       |
| L15 | O | t-butyl | t-butyl |
| L16 | S | H       | H       |
| L17 | S | H       | Methyl  |
| L18 | S | Methyl  | H       |
| L19 | S | Methyl  | Methyl  |
| L20 | S | H       | t-butyl |
| L21 | S | t-butyl | H       |
| L22 | S | t-butyl | t-butyl |

|     | X | R1      | R2      |
|-----|---|---------|---------|
| L23 | O | H       | H       |
| L24 | O | H       | Methyl  |
| L25 | O | Methyl  | H       |
| L26 | O | Methyl  | Methyl  |
| L27 | O | H       | t-butyl |

-continued

| L28 | O | t-bytyl | H       |
| L29 | O | t-butyl | t-butyl |
| L30 | S | H       | H       |
| L31 | S | H       | Methyl  |
| L32 | S | Methyl  | H       |
| L33 | S | Methyl  | Methyl  |
| L34 | S | H       | t-butyl |
| L35 | S | t-butyl | H       |
| L36 | S | t-butyl | t-butyl |

|     | R       |
|-----|---------|
| L37 | phenyl  |
| L38 | methyl  |
| L39 | t-butyl |
| L40 | mesityl |

|     | R       |
|-----|---------|
| L41 | phenyl  |
| L42 | methyl  |
| L43 | t-butyl |
| L44 | mesityl |

L45

L46

L47

L48

L49

L50

L51

L52

L53

L54

L55

L56

L57

L58

L59

L60

L61

L62

Other emissive materials include various heterocyclic optical brighteners as described in U.S. Pat. No. 4,539,507.

The emissive material can also be a polymeric material, a blend of two or more polymeric materials, or a doped polymer or polymer blend. The emissive material can also be a combination of more than one nonpolymeric and polymeric materials with or without dopants. Typical dopants are listed previously for nonpolymeric molecules. Nonpolymeric dopants can be molecularly dispersed into the polymeric host, or the dopant could be added by copolymerizing a minor constituent into the host polymer. Typical polymeric materials include, but are not limited to, substituted and unsubstituted poly(p-phenylenevinylene) (PPV) derivatives, substituted and unsubstituted poly(p-phenylene) (PPP) derivatives, substituted: and unsubstituted polyfluorene (PF) derivatives, substituted and unsubstituted poly(p-pyridine), substituted and unsubstituted poly(p-pyridalvinylene) derivatives, and substituted, unsubstituted poly(p-phenylene) ladder and stepladder polymers, and copolymers thereof as taught by Diaz-Garcia et al. in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl- or dialkoxy-substituted PPP, mono alkyl-, aryl-, alkoxy-, or amino-substituted PPP. In addition, polymeric materials can be used such as poly(methyl methacrylate), poly(N-vinylcarbazole) (PVK), polythiophenes, polypyrrole, polyaniline, and copolymers such as poly(3,4-etpoly (methyl methacrylate)hylenedioxythiophene)/poly(4-styrenesulfonate) also called PEDOT/PSS.

Following the growth of the active region 130 is the deposition of the top dielectric stack 140. The top dielectric stack 140 is spaced from the bottom dielectric stack 120 and reflective to light over a predetermined range of wavelengths. Its composition is analogous to that of the bottom dielectric stack. Since the top dielectric stack 140 is deposited over an active region 130, which contains organics, its deposition temperature must be kept low in order to avoid melting the organics. As a result, a typical deposition temperature for the top dielectric stack 140 is about 70° C. In order to obtain good lasing performance, it is preferred that the peak reflectivities of the top and bottom dielectric stacks be greater than 99%, where smaller values result in larger lasing linewidths.

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most organic laser devices are sensitive to moisture or oxygen, or both, so they are commonly sealed in an inert atmosphere such as nitrogen or argon. Desiccant such as alumina, bauxite, calcium sulfate, clays, silica gel, zeolites, alkaline metal oxides, alkaline earth metal oxides, sulfates, or metal halides and perchlorates can be incorporated into the sealed device. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

For the spacer layer 170 it is preferred to use a material that is highly transparent to both the laser emission 190 and the pump-beam 180. In this embodiment 1,1-Bis-(4-bis(4-methyl-phenyl)-amino-phenyl)-cyclohexane (TAPC) was chosen as the spacer material, since it has very low absorption throughout the visible and near UV spectrum and its index of refraction is slightly lower than that of most organic host materials. This refractive index difference is useful since it helps in maximizing the overlap between the standing e-field antinodes and the periodic gain region(s) 160. Besides organic spacer materials, the spacer layer 170 can also be composed of inorganic materials, such as, $SiO_2$, since it has low absorption and its index of refraction is less than that of organic host materials. When using inorganic-based spacer layers, the materials can be deposited either by thermal evaporation or by e-beam at low deposition temperatures (around 70° C.).

The two-dimensional laser array device is optically driven by an incident pump-beam source 180 and emits laser emission 190. Depending on the lasing power density threshold of the organic laser cavity, the pump-beam can be either focused laser light or incoherent LED light. FIG. 1 shows laser emission 190 through the top dielectric stack 140 by proper design of the dielectric stack reflectance properties. In the case of an opaque (e.g., silicon) substrate, both optical pumping and laser emission occurs through the top dielectric stack 140. Alternative Organic VCSEL structures are also possible, for example, such as those described US 2004/0076203, U.S. Pat. Nos. 6,728,278, 6,690,697, US 2003/0219058, US 2003/0206145, US 2003/0161368, US 2003/0147446, US 2003/0147437, US 2002/0190638, US 2002/0171088, EP 1411732, EP 1411606, EP 1411379, and EP1408591.

The operation of the two-dimensional laser array device occurs by the following means. The pump-beam 180 transmits through the bottom dielectric stack 120 and is absorbed in the non-pixel regions and transmitted in the pixel regions of dye layer 157. Some fraction of transmitted pump-beam energy is re-emitted as longer wavelength laser light in the active region 130.

As described above the process for forming a layer of a formamide of an amino dye compound is useful in a device including a pump-beam. A layer of a formamide of an amino dye may have other applications. The process described above may be applied to forming a patterned light filter having a smooth surface, comprising: forming a layer containing a formamide of an amino dye compound on a support; and subjecting the layer to UV radiation in the pattern areas of the layer where it is desired to be selectively light absorptive for a time sufficient to shift the absorption envelope of the layer.

The process described above may also be applied to forming an information record employing a unimolecular reaction, comprising: forming a layer containing a unimolecularly reactive compound such as a formamide of an amino dye compound on a support or other suitable compound such as one containing a carboxylate; and subjecting the layer to UV radiation in the pattern areas of the layer where it is desired to be selectively light absorptive for a time sufficient to shift the absorption envelope of the layer. In one embodiment the unimolecular reaction is a decarbonylation. In another embodiment the information record includes an image. Suitably, the information record may include data such as numerical data. The record may include both the unreacted "writable" layer prior to selective UV exposure and the "readable" layer after UV exposure.

As described above a layer of a formamide of an amino dye compound is useful for forming a pixel array. In addition, a layer of a formamide of an amino dye compound is useful for forming other images. For example, in one embodiment, coating the dye with a binder as described previously can form a layer of the formamide of an amino dye compound. An imaging element, for example such as the negative of an imaging silver halide film, is then placed over the layer and a UV exposure is made such that UV light passes readily through the low density areas of the image but less readily through higher density images and may be blocked completely by very high density areas of the imaging element. Areas of the layer of the formamide of an amino dye compound wherein all the dyes receive a UV exposure will have a shifted absorption maximum. Areas of the layer of the formamide of an amino dye compound wherein none of the dyes receive a UV exposure will not have a shifted absorption maximum. In some areas of low to moderate exposure, only some of the dyes may have absorbed UV light and hence only these dyes will shift their absorption maximum. In this manner an image will be created.

The following example is presented as further understandings of the present invention and is not to be construed as limitations thereon.

SYNTHETIC EXAMPLE

Preparation of Inv-8

Acetic-formic anhydride was prepared by combining acetic anhydride (2.6 g, 26 mmol) and formic acid (1.2 g, 26 mmol) under nitrogen atmosphere and then heating in an oil bath at 50° C. for 1 h. The dye N-(1-(2-hydroxyphenyl)ethylidene)-N'-methyl-4-benzenediamine was dissolved in 9.6 mL of dry THF and then placed in an ice-bath and cooled at 0 to 10° C. The solution of acetic-formic anhydride was added to the solution of the dye in one portion. After addition, the reaction was slowly warmed and after 1 h the reaction was complete as determined by analysis using thin layer chromatography. Ice-water was added to the reaction mixture to precipitate the product. The product was collected and dried to afford 0.98 g of Inv-8. The $H^1$-NMR spectrum was consistent with the structure of Inv-8.

SYNTHETIC EXAMPLE

Preparation of Inv-1

Figure 3:
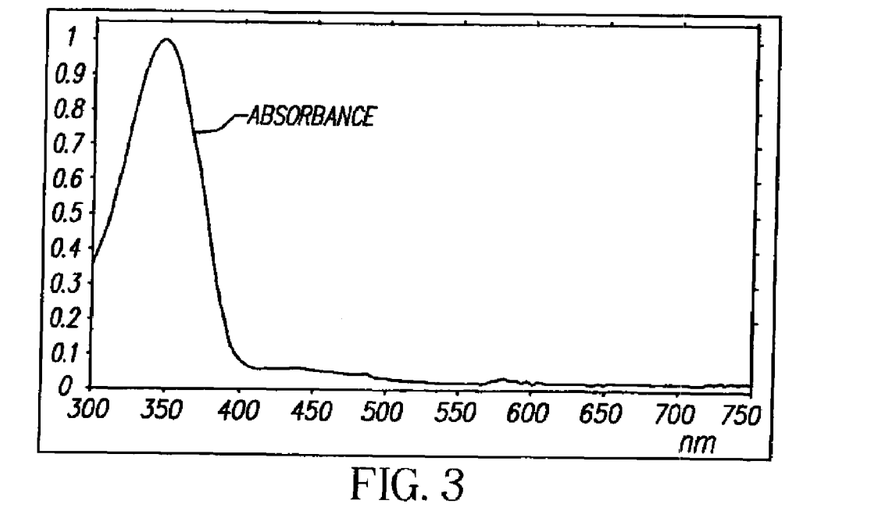
FIG. 3. Shows a solution spectrum of Inv-1.
Figure 4:
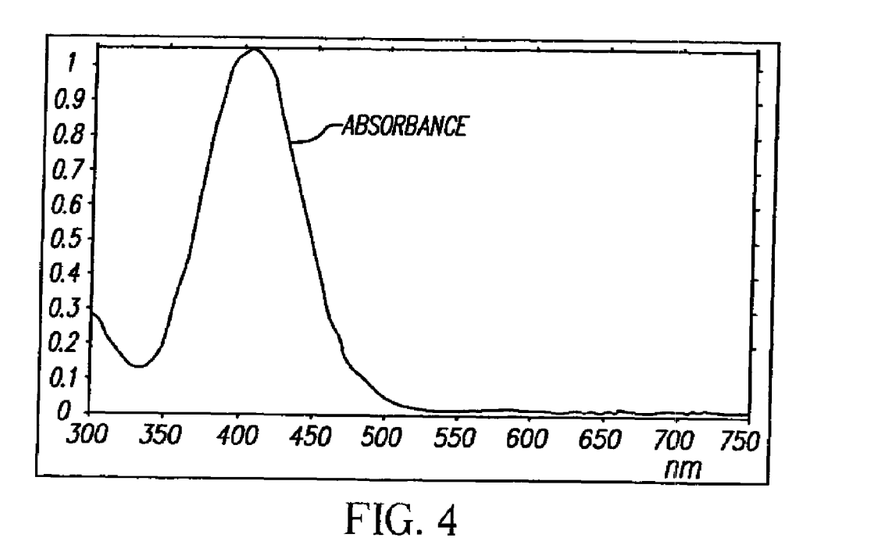
FIG. 4. Shows a solution spectrum of Inv-1 after UV light exposure.

Inv-1 was prepared in a manner similar to Inv-8 by reaction of N-phenyl-4-phenylazo-benzeneamine with acetic-formic anhydride. The $H^1$-NMR spectrum of the isolated product was consistent with the structure of Inv-1. The UV-visible spectra of Inv-1 and its precursor, N-phenyl-4-phenylazo-benzeneamine, were measured in ethyl acetate and are shown in FIG. 3 and FIG. 4 respectively. Inv-1 has a maximum light absorption at a wavelength of 346 nm. Dye N-phenyl-4-phenylazo-benzeneamine has maximum has a maximum light absorption at a wavelength of 406 nm.

LAYER EXAMPLE

Formation of a Layer Including Inv-8 and Exposure to UV Light

A spin coating of Inv-8 was generated in the following manner. A 3% solution of Inv-8 was prepared by dissolving 0.03 g of Inv-8 in 1.0 g of a 4% solution of poly(methyl methacrylate) in anisole. A portion (0.5 mL) of this solution was spin coated onto a glass slide at 1000 rpm. Rotation continued for approximately 30 sec after deposition of the solution onto the slide. A thin layer including Inv-8 was formed that had an optical density of 1.16 absorbance units at 330 nm.

Figure 5:
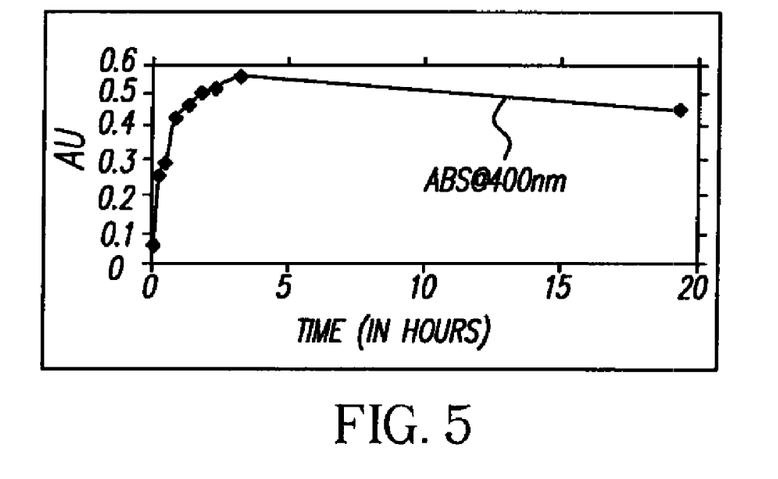
FIG. 5. Represents a plot of time versus the increase in absorbance at 400 nm of a layer containing Inv-8 upon UV irradiation.
Figure 6:
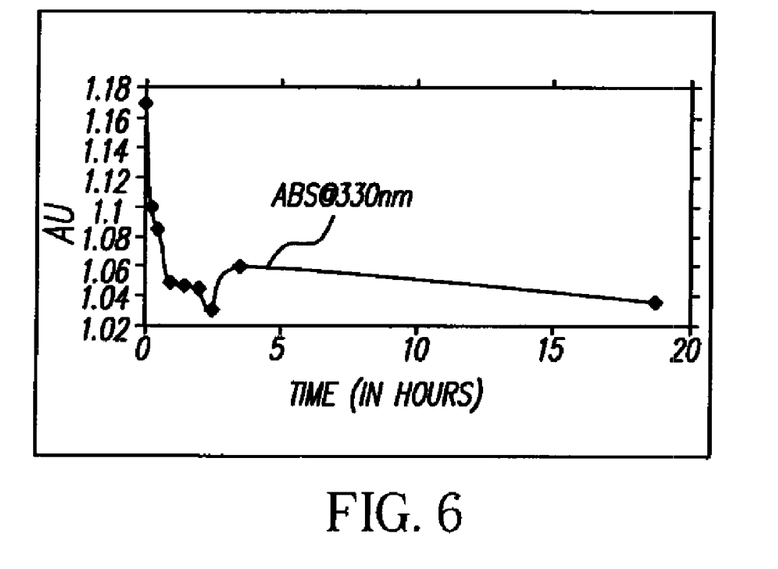
FIG. 6. Represents a plot of time versus the decrease in absorbance at 330 nm of a layer containing Inv-8 upon UV irradiation.

The coating was exposed with a UV radiation at a wavelength of 254 nm and spectra of the layer were measured at time intervals corresponding to 0, 15, 30, 60, 90, 120, 150, 210, and 1125 min. of exposure. FIG. 5 is a plot of the increase in light absorbance at 400 nm of the layer versus time. FIG. 6 is a plot of the decrease in light absorbance at 330 nm of the layer with time. As can be seen from the figures, upon exposure to UV light the layer rapidly absorbs significant amounts of light at 400 nm with a corresponding decrease in density at 330 nm. Thus, if this layer were part of an Organic VCSEL, such as dye layer 157, and if the pump beam emitted light at approximately 400 nm, then exposure of this layer to UV light has created an interpixel region.

PARTS LIST 104 laser array device
110 substrate
120 bottom dielectric stack
130 active region
140 top dielectric stack
150 lower net gain region
155 absorbing elements
157 dye layer
160 periodic gain region
170 spacer layer
180 pump-beam
190 laser emission
200 laser pixel
210 interpixel region

The invention claimed is:

1. A process for forming a laser pixel array useful with a pump-beam, comprising:
   a) forming a layer containing a formamide of an amino dye compound on a support wherein the layer absorbs light outside the laser wavelength and predominantly outside the pump-beam wavelength range; and
   b) subjecting the layer to UV radiation in the areas of the layer where it is desired to be free of pixels for a time sufficient to shift the absorption envelope of the areas into the pump-beam wavelength range.

2. A process according to claim 1 wherein the pump-beam wavelength range includes 370 to 410 nm.

3. A process according to claim 1 wherein laser wavelength is between 450 to 480 nm.

4. A process according to claim 1 wherein the laser wavelength is between 510 and 550 nm.

5. A process according to claim 1 wherein the laser wavelength is between 610 and 650 nm.

6. A process according to claim 1 wherein the formamide compound is selected so that the absorption envelope shifts such that the wavelength of maximum light absorption changes by at least 20 nm.

7. A process according to claim 1 wherein the formamide compound is selected so that the absorption envelope shifts such that the wavelength of maximum light absorption changes by at least 40 nm.

8. A process according to claim 1 wherein the formamide compound is selected so that the layer absorbs less than 5% of the light at the laser wavelength.

9. A process according to claim 1 wherein the formamide compound is selected so that the layer absorbs less than 1% of the light at the laser wavelength.

10. A process according to claim 1 wherein the formamide compound is selected so that the layer containing the formamide of the dye compound absorbs less than 20% of the light in the pump-beam wavelength range.

11. A process according to claim 1 wherein the formamide compound is selected so that the layer containing the formamide of the dye compound absorbs less than 10% of the light in the pump-beam wavelength range.

12. A process according to claim 1 wherein the formamide compound is selected so that the areas of the layer which have been subjected to UV exposure absorb more than 80% of the light in the pump-beam wavelengths.

13. A process according to claim 1 wherein the formamide compound is selected so that the areas of the layer which have been subjected to UV exposure absorb more than 90% of the light in the pump-beam wavelengths.

14. A process according to claim 1 wherein the formamide compound is selected so that the areas of the layer which have been subjected to UV exposure, absorb less than 10% of the light at the laser wavelength.

15. A process according to claim 1 wherein the formamide compound is selected so that the areas of the layer which have been subjected to UV exposure absorb less than 1% of the light at the laser wavelength.

16. A process according to claim 1 wherein the formamide compound is represented by Formula (1):

(1)

wherein:
R represents hydrogen or a substituent;
$Ar^1$ represents a divalent aromatic group;
$Ar^2$ represents an aromatic group; and
W represents N or C—X, where X represents hydrogen or a substituent.

17. A process according to claim 1 wherein the formamide compound is represented by Formula (2):

(2)

wherein:
R represents hydrogen or a substituent;
each d represents an independently selected substituent, provided adjacent substituents may combine to form a ring;
X represents hydrogen or a substituent;
n is 0-4; and
$Ar^2$ represents a monovalent aromatic group.

18. A process according to claim 1 wherein the formamide compound is represented by Formula (3):

(3)

wherein:
R represents hydrogen or a substituent;
each d represents an independently selected substituent, provided adjacent substituents may combine to form a ring;
n is 0-4;
$Ar^2$ represents an aromatic group.

* * * * *